(12) United States Patent
Pasternak

(10) Patent No.: US 6,741,449 B1
(45) Date of Patent: May 25, 2004

(54) DIRECT DIGITALLY TUNABLE MICROWAVE OSCILLATORS AND FILTERS

(75) Inventor: Eliezer Pasternak, Palo Alto, CA (US)

(73) Assignee: Bridgewave Communications, Inc., Santa Clara, CA (US)

( * ) Notice: Subject to any disclaimer, the term of this patent is extended or adjusted under 35 U.S.C. 154(b) by 0 days.

(21) Appl. No.: 09/376,867

(22) Filed: Aug. 18, 1999

(51) Int. Cl.$^7$ ................................ H01G 4/005
(52) U.S. Cl. .............. 361/303; 361/302; 361/305; 361/306.1; 361/306.3
(58) Field of Search ................. 361/303, 302, 361/305, 307, 308.1, 306.1, 306.3, 301.1, 301.4, 309, 320, 321.1, 321.5, 328–330, 277, 278, 279, 282, 281, 298.2

(56) References Cited

U.S. PATENT DOCUMENTS

| 5,608,263 A | 3/1997 | Drayton et al. ............. 257/728 |
| 5,821,836 A | 10/1998 | Katechi et al. ............. 333/202 |
| 5,959,516 A | * 9/1999 | Chang et al. |

OTHER PUBLICATIONS

J.B. Muldavin et al., "30 GHz Tuned MEMS Switches", IEEE MTTS 1999, no date.
Z. Feng et al., "Design and Modeling of RF MEMS Tunable Capacitors Using Electro–thermal Actuators", IEEE MTTS–1999, no date.
H. Kim et al., "Millimeter Wave Micromachined Tunable Filters", IEEE MTTS Digest, pp 1235–1238, 1999, no date.
C.T. Nguyen et al., "Micromachined Devices for Wireless Communications", Proceedings of the IEEE, vol. 86, pp 1756–1768, 1998, no date.
J. Yao et al., "High Tuning Ration MEMS–Based Tunable Capacitors for RF Communications Applications", Solid State Sensor and Actuator Workshop, Hilton Head, South Carolina, Jun. 8–11, 1998.

* cited by examiner

Primary Examiner—Anthony Dinkins
Assistant Examiner—Nguyen T. Ha
(74) Attorney, Agent, or Firm—Gray Cary Ware & Freidenrich LLP

(57) ABSTRACT

A tunable element in the microwave frequency range is described that may include one or more tunable elements that are directly digitally controlled by a digital bus connecting a digital control circuit to each controlled element. In particular, each digital signal is filtered by a digital isolation technique so that the signal reaches the tunable elements with very low noise. The low noise digital signals are then converted to analog control voltages. The direct D/A conversion is accomplished by a special D/A converter which is manufactured as an integral part of a substrate. This D/A converter in accordance with the invention may consist of a resistor ladder or a directly digitally controlled capacitor. The direct digitally controlled capacitor may be a cantilevered type capacitor having multiple separate electrodes or sub-plates representing binary bits that may be used to control the capacitor. A low cost microwave oscillator is disclosed in which some of the filters and oscillators are direct digitally tuned elements.

11 Claims, 12 Drawing Sheets

DIRECT DIGITALLY TUNABLE MICROWAVE OSCILLATORS AND FILTERS

BACKGROUND OF THE INVENTION

This invention relates generally to a communications device and in particular to direct digitally tunable microwave oscillators and filters that enable a low-cost high-speed digital transceiver in the millimeter wave frequency range.

Telecommunication deregulation and the growth of the Internet are causing a large demand for broadband communications network access to homes and offices at increasing bit rates. For Internet access, a Digital Subscriber Loop (DSL) service and similar techniques are becoming popular. However, the speed of the DSL service is limited by the fact that the data travels over long telephone twisted copper wire pairs. Cable modems are also becoming prevalent methods of Internet and telephony access. However, the return channel for a cable modem is quite limited in speed by the nature of cable distribution technology. Fiber optics offers higher access speeds than the other systems and services, but fiber does not currently reach most homes and offices and installation of new fiber is very expensive.

To overcome these limitations with current systems, service providers and users are considering using digital wireless communications as a possible alternative access system. Various radio frequency bands are in fact currently allocated to applications that include broadband wireless access, however, most of the available bandwidth is in the millimeter wave range, ranging roughly from 15 to 66 GHz. Among these bands, the USA Local Multipoint Distributed Services (LMDS) bands in the 28 to 30 GHz range are a good example of a licensed band intended for telecom access applications. Since LMDS is a licensed band, the license owner has the exclusive rights to use the band for such services, thus ensuring interference-free operation.

LMDS services may use point to multipoint communication networks. The LMDS service provider typically maintains base station antennas on tall structures to maintain line of sight to a large number of user-buildings in a sector. Each subscribed user gets a small transceiver installed outdoors. While the base station cost is divided among many users, the subscriber transceiver serves only one user or at the most few users in a shared building. Thus, the cost of the transceiver must be kept low for the LMDS service to be economical. The option of reducing the cost of the transceiver by using a lower frequency is not always practical since it may be precluded by spectrum availability limitations so that millimeter wave transceivers are desirable, but too expensive for many applications. To make millimeter wave communications cost effective, a drastic cost reduction of the millimeter wave transceivers is required.

A typical millimeter wave transceiver includes a frequency synthesizer that generates the final millimeter wave frequency with an offset of a few GHz depending on the particular radio application. The synthesizer is required for accurately setting the exact transmit and receive frequencies of the communications. An undesirable by-product of frequency synthesis is phase noise that must be kept within acceptable performance levels for a particular radio link. Furthermore, a synthesizer may require a large tuning range, usually a few hundred MHz, to allow it to tune to alternate channels. A common way of implementing a synthesizer is to use a base phase locked loop at a lower frequency, such as around 2 GHz, and a chain of frequency multipliers. For example, a 28 GHz signal may be synthesized from a 1.75 GHz signal multiplied by 16 (i.e., 2×2×2×2) which may be implemented using a chain of four frequency doublers.

There are several limitations to the above typical frequency synthesizer. The cost of the synthesizer is significant because the frequency doublers add complexity and cost. Furthermore, the synthesizer is very sensitive to noise. In particular, the phase locked-loop in the synthesizer has a voltage controlled oscillator (VCO). The tuning voltage of that VCO causes the final frequency of the VCO to vary by a few MHz so that one millivolt of noise in the phase locked loop control voltage may cause a frequency deviation of 500 kHz. This frequency deviation may cause temporary loss of frequency lock and large bit errors in the communications data stream which are both undesirable.

Apart from the frequency synthesizer, the millimeter-wave filters in a transceiver also increase the cost of the transceiver, especially in frequency division duplex (FDD) transceivers in which a diplexer is used. The above is also true for a time division duplex (TDD) receiver which also needs filters. Thus, it is desirable to provide a direct digitally tunable oscillator and filter that overcomes the above limitations and problems with typical oscillators and filters that may be used in millimeter wave transceiver devices and systems and it is to this end that the present invention is directed.

SUMMARY OF THE INVENTION

The tunable filters and oscillators in the microwave frequency range in accordance with the invention may include one or more tunable elements that are directly digitally controlled by a digital bus connecting a digital control circuit to each controlled element. In particular, each digital signal is filtered by a digital isolation technique so that the signal reaches the tunable elements with very low noise. The low noise digital signals are then converted to analog control voltages. The direct D/A conversion is accomplished by a special D/A converter which is manufactured as an integral part of a substrate. This D/A converter in accordance with the invention may consist of a resistor ladder or a directly digitally controlled capacitor.

The digitally controlled capacitor is tuned by electrostatic attraction in which one of the capacitor plates may bend towards a control plate or a set of control plates that causes an increase in the capacitance of the capacitor. The digital control in accordance with the invention may be achieved by partitioning the set of control plates into a plurality of sub-plates whose positions and dimensions (area) affect the overall capacitance of the capacitor such that each sub-plate represents a single weight of a weighted binary sum. In other words, a larger plate may have an area A (equal to one half the size of the other plate of the capacitor), while a smaller plate has an area of A/2, a still smaller plate has an area of A/4 and a smallest plate has an area of A/8.

To control/tune the capacitor to a desired capacitance, one or more of the plates are charged with low noise voltages (Vcc or 0) to produce the desired capacitance. For example, if only the largest plate is charged, the capacitance of the capacitor may be about ½ of its total value. It the first and second plates are energized (A+A/2), then the capacitor has a capacitance equal to about ¾ of its total value. In this manner, each plate represents a binary weight (1, ½. ¼, ⅛, etc.) that may be used to control the capacitor. Any final fine-tuning of the capacitor may involve a small sub-plate driven by an analog voltage. The controlling of the capacitor in turn is used to tune a microwave circuit such as a oscillator or filter.

Various different capacitor structures are possible in accordance with the invention. In accordance with the invention, these capacitor structures are modified micromachined parallel plate cantilever capacitors or interdigital capacitors. In addition, various combinations and orientations of the set of sub-plates relative to the other plate are possible to accomplish the desired weight distribution of the digital control word in accordance with the invention. For example, the set of sub-plates may be positioned perpendicular to the cantilever plate or parallel to the cantilever plate in cantilever capacitor in accordance with the invention.

These digitally controlled capacitors in accordance with the invention may be used to control the frequency of an oscillator or of a filter, especially in the microwave frequency range. By combining a digital tuner, a resonator and active microwave devices, a digitally controlled oscillator (DCO) is accomplished. The DCO in accordance with the invention with proper digital noise isolation may be connected to a digital circuit simplifying the implementation of a microwave frequency synthesizer by eliminating the analog control local yet allowing wide tuning range with minimum noise.

The digitally controlled devices in accordance with the invention may also be used to implement other electrically tuned devices, such as semiconductor varactor diodes. The low noise digital tuning may be accomplished by implementing a resistor ladder type of D/A converter in accordance with the invention that requires no active devices between the noise-reduced digital control word and the controlled device. The resistors may be deposited on a metal layer that acts as a shield from the circuit substrate. This can be accomplished by various well known thin film techniques. To further reduce noise, some of these resistors which are connected to the control bits may be placed outside a shielded microwave circuit containing the tunable element, and are fed to the shielded region via bypass capacitors, forming and RC low pass filter.

With direct digitally tuned microwave elements in accordance with the invention, a low cost microwave transceiver is disclosed in which some of the filters and oscillators are direct digitally tuned to reduce noise. The tuning is possible even in the transceiver front-end diplexer. The tuning in accordance with the invention may reduce the number of required diplexer filtering stages and may be used also to tune away undesired signals that are not rejected by a conventional band pass filter inside a diplexer.

In accordance with another aspect of the invention, the partitioning of the sub-plates by size (area) and position may be done with a method in accordance with the invention that includes the steps of placing a first sub-plate of a desired weight-effect where desired and adjusting the width of this plate until the desired weight-effect associated with this sub-plate is achieved and confirmed by measurement or simulation. Then a second sub-plate is placed in the presence of the first plate and its dimensions are adjusted until the desired weight-effect associated with this second sub-plate is achieved and confirmed by measurement or simulation. This process is repeated for all remaining plates to achieve the direct digitally tuned element in accordance with the invention.

Thus, in accordance with the invention, a direct digitally controlled microwave tuning element is provided comprising a microwave circuit that is being tuned to a predetermined microwave frequency and an electrically tunable element for tuning the microwave circuit to the predetermined microwave frequency. The electrically tunable element may be attached to a substrate and may further comprise a plurality of tuning signals, means for noise filtering said tuning signals to generate noise filtered tuning signals, a converter, based on the noise filtered tuning signals, that controls the frequency of the microwave circuit to a predetermined microwave frequency and an analog tuning signal that is integrated into the substrate and mounted on said noise filtering means.

In accordance with another aspect of the invention, a direct digitally controlled element for tuning to a microwave frequency is provided wherein the element comprises means for generating one or more digital signals, means for noise isolating the one or more digital signals in order to reduce the noise contained in the one or more digital signals, and means for controlling a device using the noise isolated digital binary signals, the device changing a predetermined characteristic in response to the digital signals so that the device tunes itself to a microwave frequency based on the digital signals.

In accordance with yet another aspect of the invention, a direct digitally controlled capacitor for tuning a circuit to a microwave frequency is provided wherein the capacitor comprises a control plate that deflects in response to a second plate being charged and a plurality of tuning signals attached to the sub-plates of the capacitor for controlling the capacitor. The second plate further comprises one or more sub-plates electrically isolated at DC or low frequencies from each other and from said moving plate, the sub-plates controlling the deflection of the moving plate in order to change the microwave frequency response of the capacitor. In accordance with yet another aspect of the invention, a digital microwave transceiver is provided comprising means for receiving a signal to be transmitted using a microwave frequency, and means for modulating the signal onto a predetermined microwave frequency, the modulator comprising one or more direct digitally tuned circuits for precisely controlling the predetermined microwave frequency of the modulator.

In accordance with yet another aspect of the invention, a method for determining the sub-plates areas of one or more sub-plates in a tuning device is provided, comprising positioning a first sub-plate of a largest weight-effect in a predetermined location, adjusting the dimensions of said first sub-plate until the desired weight-effect associated with said sub-plate is achieved, positioning a second sub-plate of a smaller weight-effect adjacent the first sub-plate, and adjusting the dimensions of the second sub-plate until the desired weight-effect associated with said second sub-plate is achieved.

In accordance with other aspects of the invention, a direct digitally controlled oscillator is provided wherein the oscillator comprises a tunable oscillator circuit, and a direct digitally tuned circuit connected to the oscillator circuit for controlling the frequency of the oscillator circuit. A direct digitally tunable filter is also provided wherein the filter comprises at least one resonator element, and at least one direct digitally tuned circuit electrically coupled to said resonator to control the frequency of the resonator.

DETAILED DESCRIPTION OF A PREFERRED EMBODIMENT

The invention is particularly applicable to digitally controlled oscillators and filters for use in a microwave transceiver or microwave access terminal and it is in this context that the invention will be described. It will be appreciated, however, that the device and method in accordance with the invention has greater utility, such as to other communications systems that require a tuned oscillator or filter. Before describing the invention, a typical microwave subscriber terminal that may include a digitally controlled filter or oscillator in accordance with the invention will be described.

Figure 1:
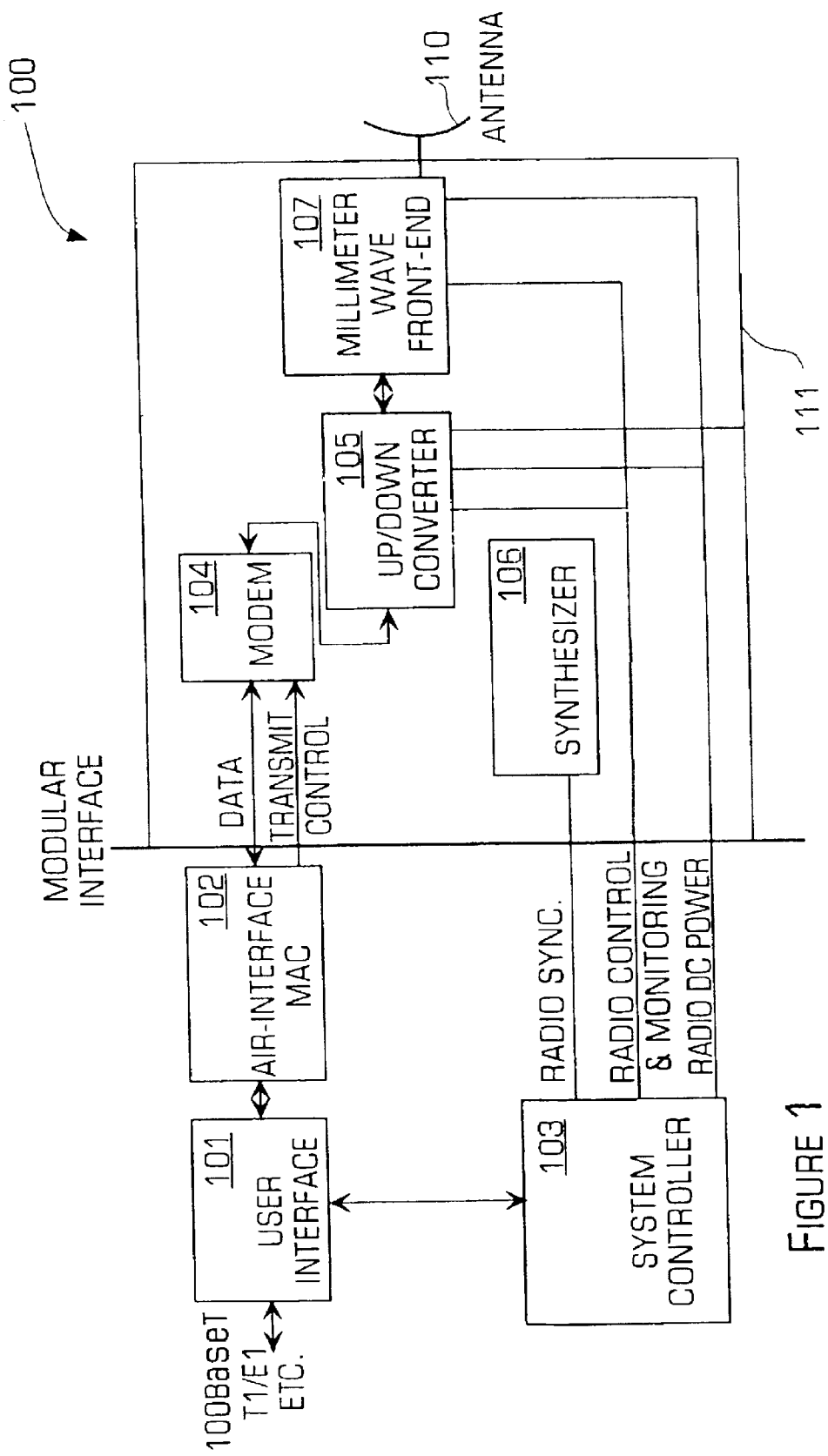
FIG. 1 is a block diagram of a typical radio access terminal including a radio transceiver module portion.
Figure 2:
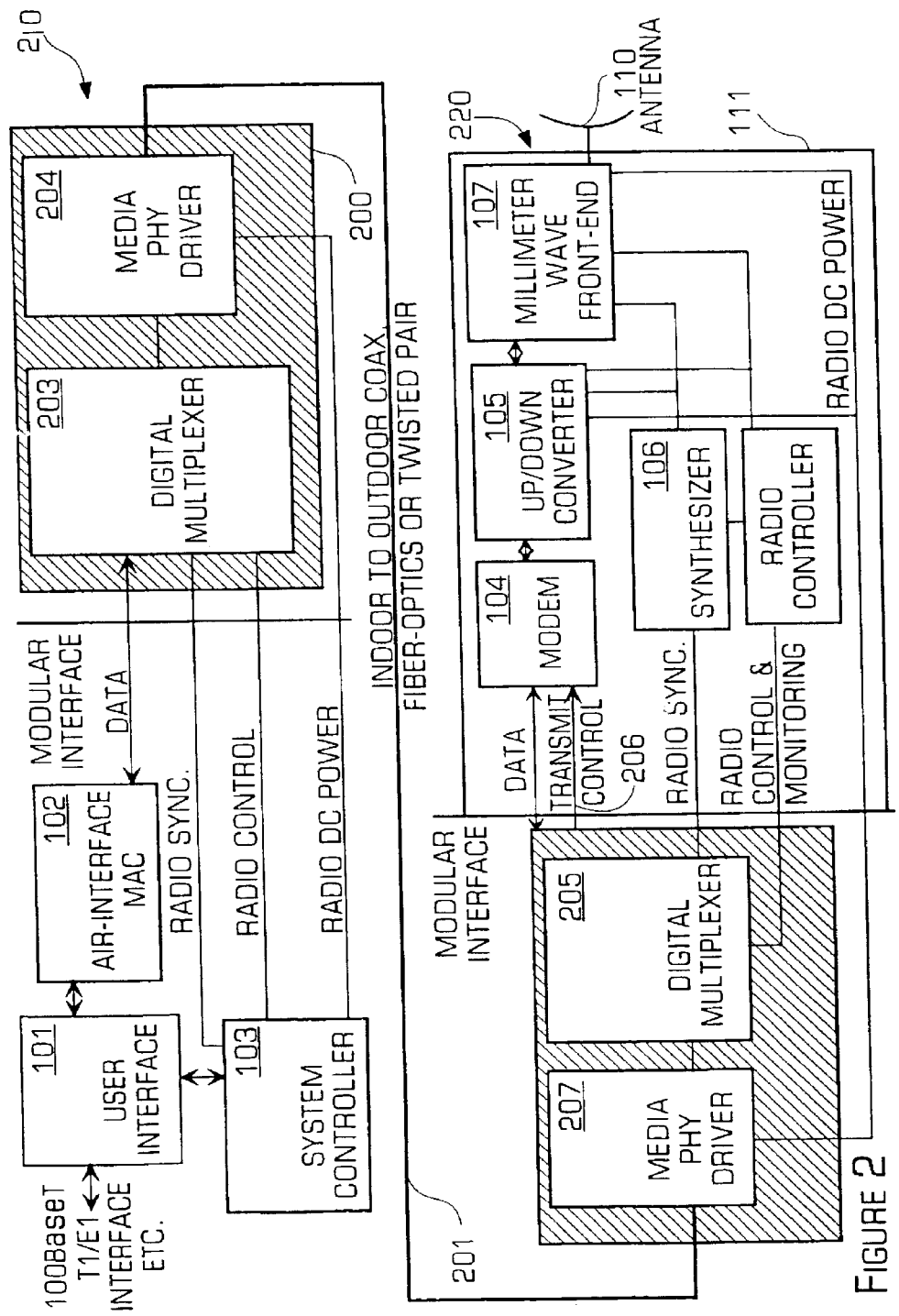
FIG. 2 is a block diagram of a typical radio access terminal divided into indoor and outdoor units with a digital interface between them.

A typical digital microwave transceiver 100 for a subscriber terminal in a fixed wireless network is shown as a block diagram in FIG. 1. In particular, FIG. 1 shows an integral outdoor transceiver 100 while FIG. 2 shows a split transceiver 200, including an indoor unit 210, an outdoor unit 220 and a connecting cable 201 between them. The integral unit of FIG. 1 includes a user interface 101 for interfacing between the communications system and the microwave transmission and reception system and converting user traffic to a serial bitstream for transmission over the air, an air-interface media access control layer (MAC) 102 if applicable for the wireless network in use, a system controller 103, for configuration, protocol processing and network management tasks and a antenna 110 for receiving/transmitting the microwave signals. The transceiver-related functions more directly related to the present invention are depicted inside a block 111 having a gray background. These functions are included in a modem 104 for converting the serial bit stream into modulated signals and vice versa, an up/down frequency converter 105 for converting between different frequencies, a synthesizer 106 for setting the proper radio frequency for communication and a millimeter wave front-end 107 that performs the higher frequency transceiver functions. The control signals between these units and the system controller are shown although not described since these are well known. The functions depicted in FIG. 1 are well known and typical for a microwave transceiver and will not be described here in any more detail. The separation of the transmit-receive functions, the number of conversion stages, the DC power supply and other radio-related features are omitted from the figure since these are also well known in the art.

FIG. 2 illustrates a split transceiver 200 including an indoor unit 210 and an outdoor unit 220. The split transceiver of FIG. 2 includes the same blocks as the transceiver shown in FIG. 1 and further includes an indoor to outdoor connection medium 201 that may be a coaxial cable, a fiber optic cable, a twisted pair cable or combinations of such media. An integral transceiver is likely to be more cost-effective, however various constraints in the field, such as distance from the user to the outdoor unit, may necessitate a split implementation. In a split transceiver, one typical partition between the indoor unit and the outdoor unit is to keep the modem indoors and use intermediate frequency (IF) signals for indoor to outdoor transmission. A lower cost typical approach is shown in FIG. 2 in which the modem 104 is outdoors and the media 201 transmits multiplexed digital information to the modem using a digital multiplexer 203 and a media physical layer driver (Media PHY) 204. The multiplexed signal contains the data, timing reference and control information. For example, a transmission may consist of a start-stop protocol as used in a serial port of a UART. The start bit indicates when a transmission in the air should start. A media PHY driver 207 and multiplexer 205 in the outdoor unit 220 can interpret the stop bit and control the modem 104 via a transmit control bus 206. The media PHY driver can be an off the shelf transceiver for the appropriate medium, such as 100BaseT driver for twisted pair cabling. Now, more details of the portion of the transceiver in the gray background will be described.

Figure 3:
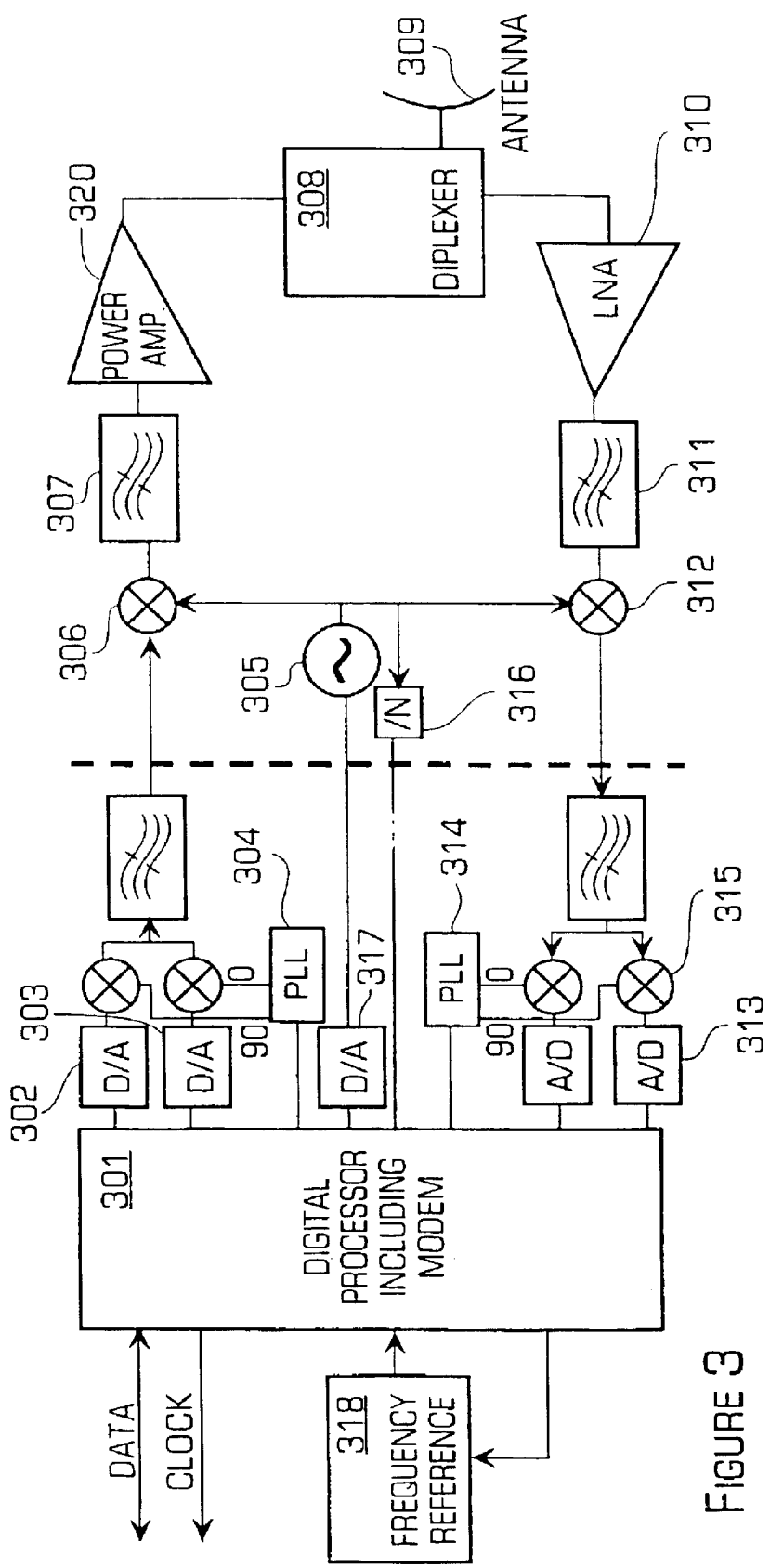
FIG. 3 is a block diagram illustrating an example of a typical radio transceiver module.

FIG. 3 illustrates the portion 111 of the transceiver in more detail. In particular, data for transmission enters a Digital Processor 301 which includes a modem. In order to transmit a signal, the well known I and Q samples of the modulation are output via two D/A converters 302, 303 followed by smoothing filters (not shown) as required which are modulating a sine wave generated by a phase locked loop (PLL) 304 at about 1 GHz. A second conversion occurs using a voltage-controlled oscillator (VCO) 305 and a mixer 306. The VCO 305 is operating at the final local oscillator frequency, such as 28 GHz. The output frequency of the mixer 306 and bandpass filter 307 is thus 29 GHz, if the filter 307 is tuned to reject the other image at 27 GHz. A power amplifier 320 drives the signal via a diplexer 308 to the antenna port 309.

To receive incoming signals, a receiving chain includes the other branch of the diplexer 308, a low noise amplifier 310, a bandpass filter 311 and a mixer 312. The receiving frequency may be 30 GHz, assuming transmit-receive frequency difference of 1 GHz. Therefore the receiving IF frequency is 2 GHz, and a receiving PLL 314 runs at this frequency. A quadrature demodulator 315 converts the frequency to baseband and the signals are digitized by an A/D converter 313, including any anti-aliasing filters (not shown) as required.

A transceiver also includes AGC functions and other functions, which are known in the art but are not relevant to this disclosure. The VCO 305 is a part of a synthesizer that tunes the transceiver. The VCO in this transceiver has noise problems which will be described below that keep the cost of the transceiver high since expensive VCO are needed to maintain the necessary spectral purity. The VCO forms a PLL with a prescaler 316, a digital circuit for phase detector and loop filter within the digital processor 301 and a D/A converter 317, also shown in FIG. 4 and described below. When receiving signals, the digital processor 301 demodulates the received signals and delivers received data to the other functions shown in FIGS. 1 and 2. The synthesizer in the digital processor is supposed to be locked to a frequency reference 318, which may be a crystal oscillator.

In some applications, to further save cost, the prescaler 316 is omitted and the synthesizer is phase locked to the received signal via the modem carrier recovery loop in the digital processor 301. Other options include running the VCO at 1/n of the desired frequency, where n is a small integer such as 2 and 3, and the mixers 306, 312 are harmonic mixers. The above typical transceiver architecture is based on frequency division duplex (FDD) as is well known. A time division duplex variant is also possible and well known, wherein the diplexer 308 is replaced by a transmit/receive switch and a single bandpass filter, and making the PLLs 304, 314 the same frequency.

Figure 4:
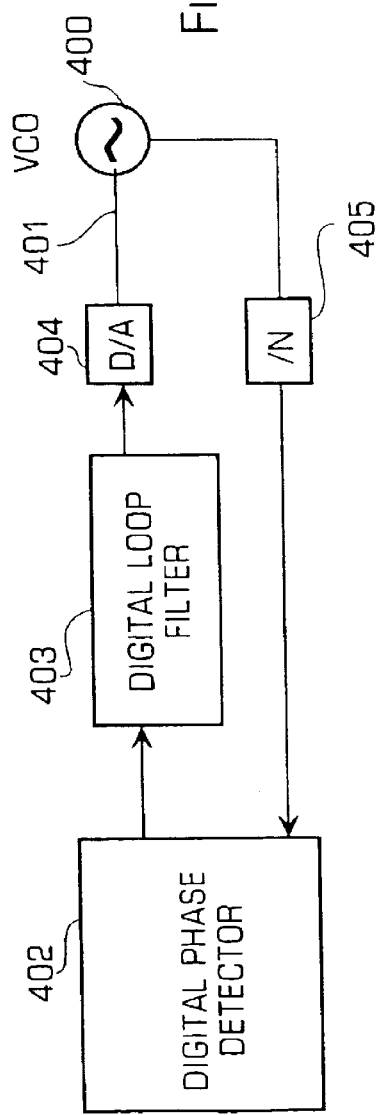
FIG. 4 illustrates a typical digital phase locked loop.

FIG. 4 illustrates a noise problem inherent in a typical VCO 400 that limits the spectral purity of the VCO and thus limits the performance of a microwave transceiver that uses the VCO. As shown in FIG. 4, a feedback loop may be formed with the VCO to control the frequency of the VCO. The feedback loop may include a digital phase detector 402, a digital loop filter 403, a D/A converter 404 and a divide by N (/N) circuit 405. In operation, the signals output from the VCO are downconverted by the /N converter and fed into the digital phase detector. The digital phase detector compares the frequency of the VCO to a standard and generates a control signal to adjust the VCO. The control signal is passed through the digital loop filter to reduce noise and then converted into an analog control signal by the D/A converter. The analog control signal is fed into the VCO to adjust the signal output from the VCO.

In more detail, a voltage control line 401 frequency-modulates the VCO. Thus, if the VCO is tunable across 500 MHz, and the voltage control range is between 0V and 5V, the VCO's sensitivity is 100 MHz/volt. Therefore, a noise spike of one millivolt (very small) will cause a abrupt 500 kHz frequency deviation that may cause frequency lock to be lost in a microwave transceiver. This noise may come from ground loops or noise induced on the line 401. To overcome this noise problem, a direct digital controlled VCO in accordance with the invention is introduced. The direct digitally controlled VCO in accordance with the invention will now be described.

Figure 5:
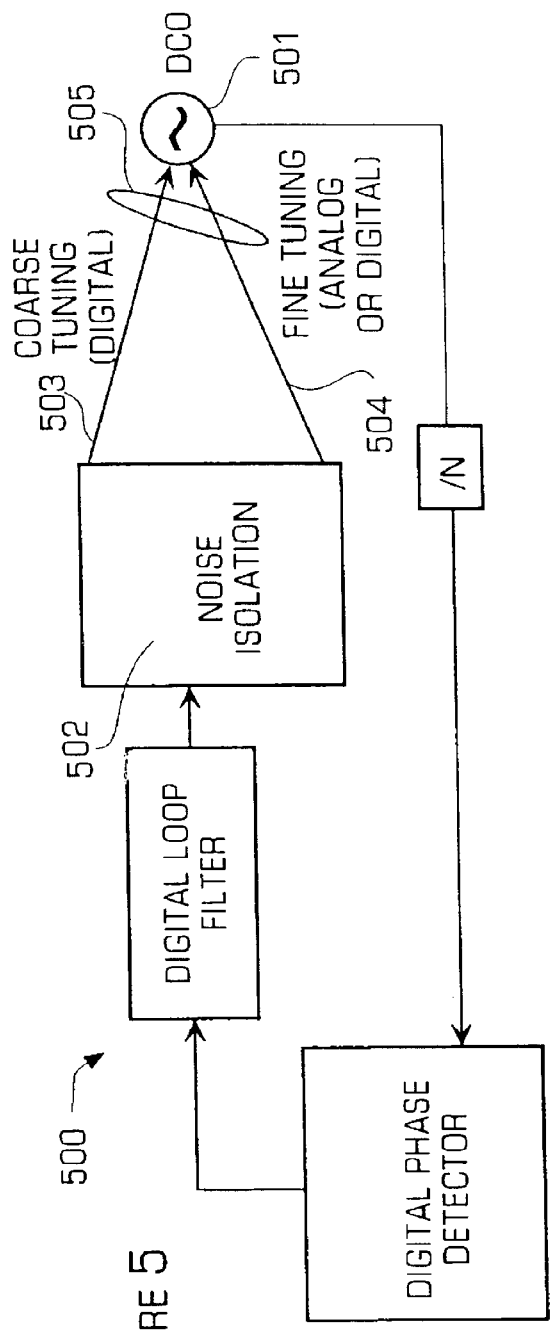
FIG. 5 illustrates a digital phase locked loop with noise isolation of the digital signals and a digitally controlled oscillator in accordance with the invention.

FIG. 5 illustrates a direct digitally controlled oscillator 500 in accordance with the invention that may also be referred to as a digitally-controlled oscillator (DCO) 501. The digital control word 505 for the DCO may be noise-isolated by a noise isolation circuit 502, and the noise-free digital word 505 may drive the DCO to produce a particular frequency signal while reducing undesirable noise. In accordance with the invention, it is also possible to split the digital control word 505 so that the coarse tuning may be completed and controlled by a set of most significant bits 503, and the fine tuning of the DCO may be completed and controlled using a signal 504 that may be either digital or analog. The analog fine tuning will require a D/A converter and it has the same noise level as the original VCO control line 401, but the DCO sensitivity of this signal is much lower. For example, if a total of 8 bits is used, and the least significant bit is controlling the DCO as an analog line ranging between 0V and 5V, the sensitivity of this line is $1/256$ of the combined original thus the noise is attenuated by 256, or 48 dB. If the digital signals are held fixed for a receiving session and the analog line is the only one tuned, the lower loop gain in the PLL further simplified the loop design and reduced the noise sensitivity of the DCO.

The number of digital bits that control the DCO is set so that the coarse setting covers all instabilities and noise except the temperature instability range of the oscillator 501 and the analog range covers that instability. If the frequency lock of the DCO 501 is lost, the digital processor 301 (shown in FIG. 3) initiates a coarse search by varying the digital signal 503 to achieve a coarse frequency lock and then uses the fine tuning signal 504 for final lock. If the number of available digital bits is large enough (to minimize the quantization noise between each digital bit), an all-digital controlled loop is possible. In particular, the lease significant digital bit defines the increment of frequency error (range of frequencies) and the DCO will wander between these frequencies. Furthermore, in an all-digital implementation, the two signals 503 and 504 may have some overlapping range. For example, the coarse tuning signal 503 may set the frequency at steps of 20 MHz, but the fine tuning signal 504 range is up to 50 MHz. Such overlap is possible because the weights of each fine tuning bit is not necessarily another power of 2. For example, the digital bits of the coarse signal 503 may have weights of 128, 64, 32, 16 and 8 and the fine bus may have weights 14,8,4,2,1 wherein the weight of 14 is an example of non-power of 2. In operation, the DCO frequency, assuming linear control characteristics, is therefore proportional to the sum of the weights for all the digital bits set to 1. For example, with the above order of bits, the control words on the signals 503, 504 may have a value of "1000010001" may set a frequency of the DCO 501 proportional to 128+14=142 which means that the actual frequency of the DCO will be a little above the halfway point (142/255) of the tuning range. If the DCO control is not linear, the frequency is still a monotonic function of the sum of weights if the DCO is well designed. Now, the noise isolation in accordance with the invention will be described in more detail.

Figure 6:
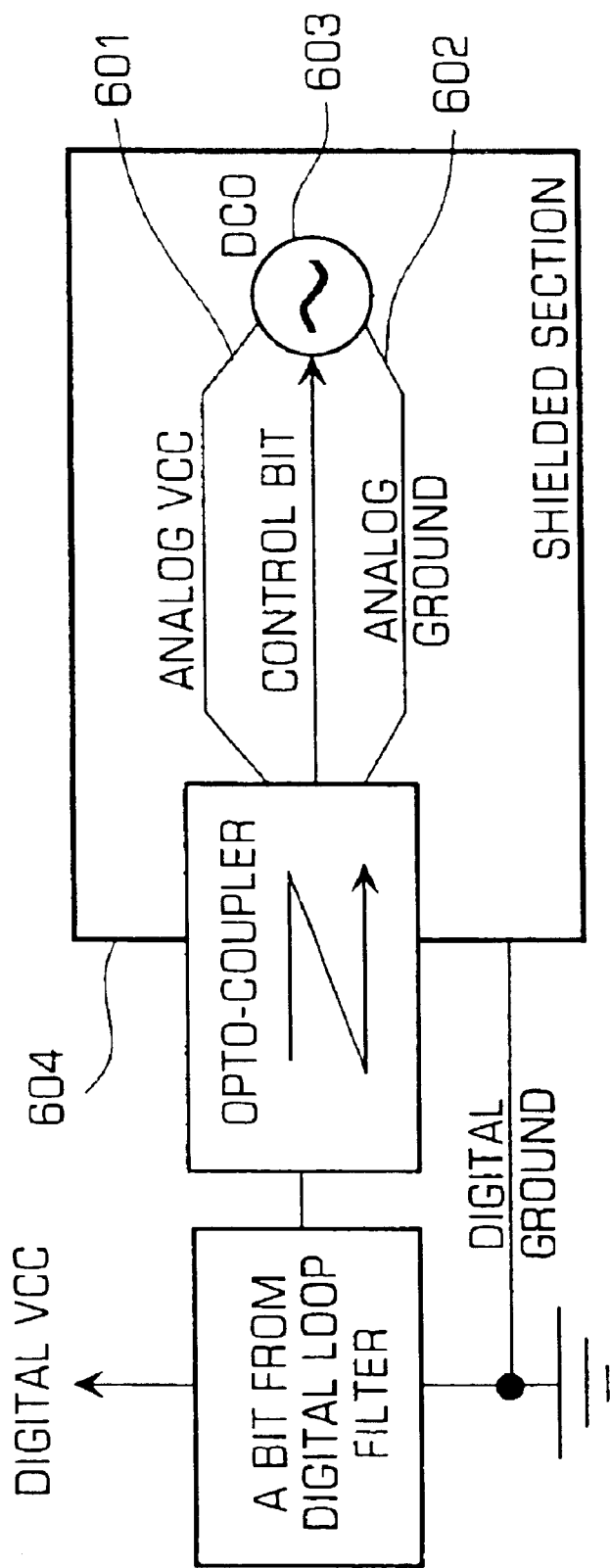
FIG. 6 illustrates an example of a digitally controlled oscillator in accordance with the invention with noise isolation by optical coupling.
Figure 7A:
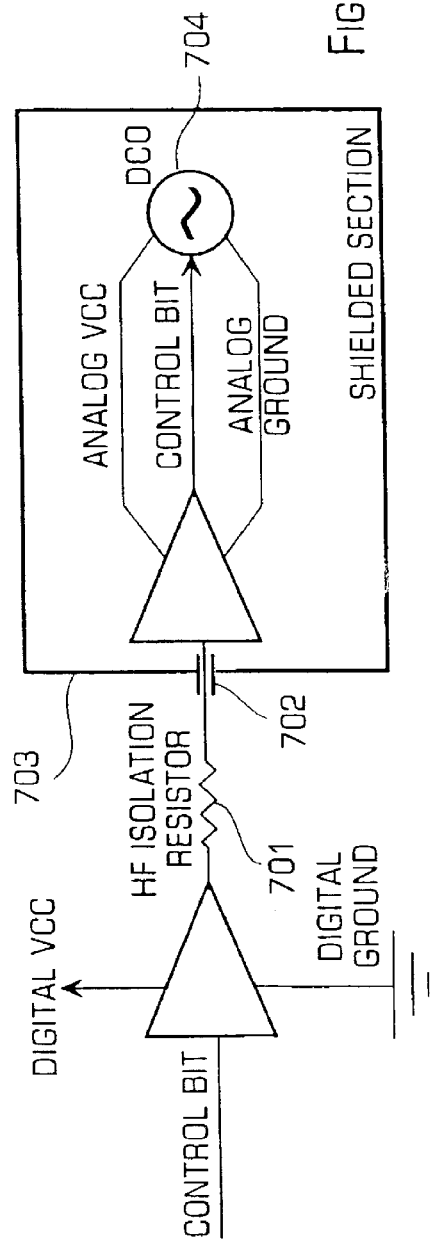
FIG. 7a illustrates an example of a digitally controlled oscillator in accordance with the invention with noise isolation using a resistor and a feed-through capacitor.

FIGS. 6 and 7a illustrate two methods in accordance with the invention for performing noise isolation. In FIG. 6, an all digital signals may be opto-coupled to the DCO 603 through a shielded enclosure 604, and the digital levels are drawn from an analog supply voltage VCC 601 and a local analog ground 602. In FIG. 7, one or more isolation resistors 701 may provide the desired noise isolation by performing low-pass RC filtering with a feed-through capacitance 702 of a shield 703 surrounding the DCO 704. Now, a direct digitally tuned microwave element in accordance with the invention will be described in more detail.

Figure 7B:
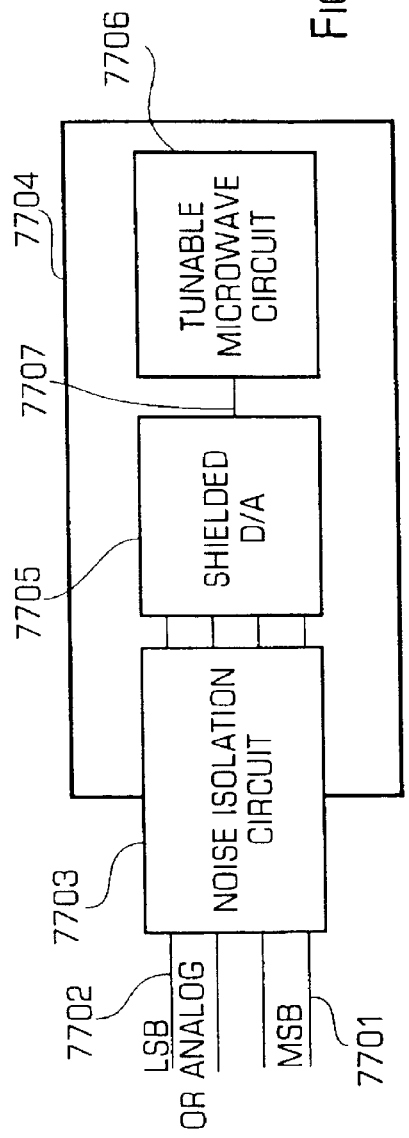
FIG. 7b illustrates an example of a noise-isolated direct digitally controlled microwave circuit in accordance with the invention.

FIG. 7b illustrates a direct-digitally tuned microwave element 7700 in accordance with the invention. In operation, one of more digital signals 7701 and, optionally, an analog signal 7702 may enter a noise isolation circuit 7703 in a shielded structure 7704. The output of the noise isolation circuit 7703 may drive a shielded D/A converter 7705 and the resulting analog signal from the D/A converter may tune a microwave circuit 7706. The shielded D/A converter, in addition to a metal cover, may include a metal barrier between the D/A elements, such as resistors or control plates to be discussed below, and the substrate to which these elements are attached. The tuning signal of the microwave circuit is shown as a wire 7707 in this embodiment. However, in some embodiments of this invention, this signal is not a voltage in a wire, but a direct physical phenomenon in the tunable circuit 7706, such as a deflection of a capacitor plate that changes the tuning. Now, several embodiments of a direct digitally controlled element in accordance with the invention that may be used to tune a microwave element will be described.

Figure 8:
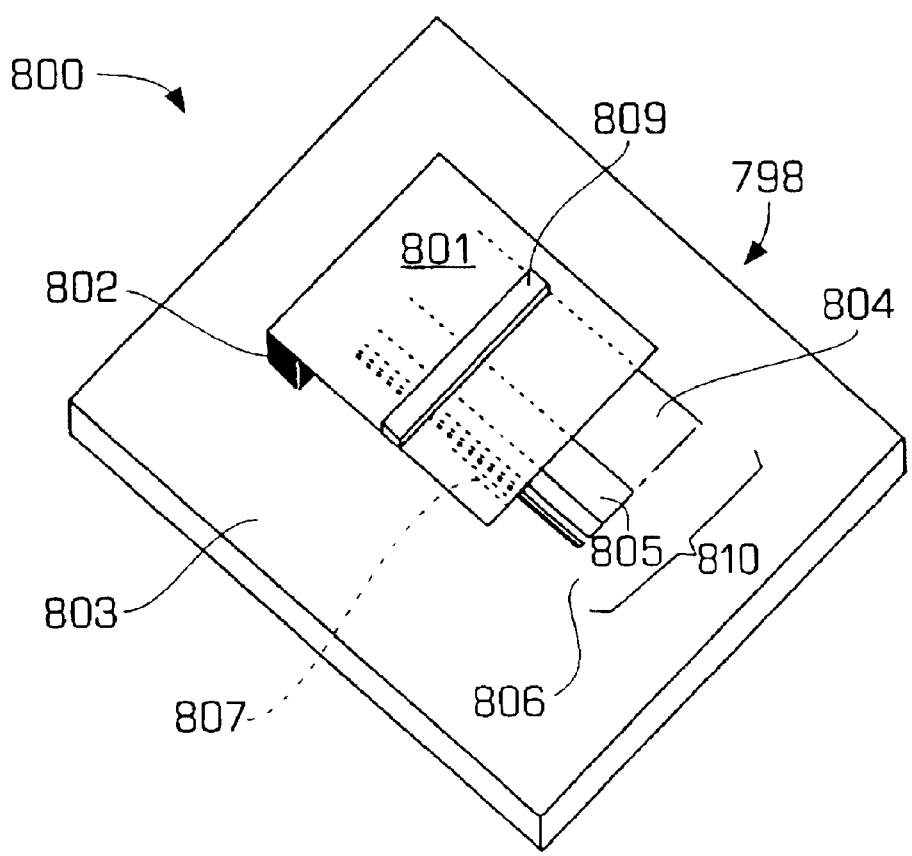
FIG. 8 illustrating an example of a digitally controlled capacitor in accordance with the invention with a moving cantilever beam and sub-plates arranged in parallel to the beam.

FIG. 8 illustrates an embodiment of a direct digitally tuned element 798 that may be a digital varactor 800 in the embodiment. This varactor 800 is a two-plate air-gap capacitor that may include a first cantilevered plate 801 that may be a wide cantilever beam supported on and cantilevered from an insulating foundation 802. The insulating foundation may be attached to a substrate 803 made of a flat rigid material, such as a silicon wafer. A second plate 810 may be divided into a plurality of sub-plates as described below with varying dimensions and areas that may be mounted on the substrate so that there is an air gap between these sub-plates and the cantilevered plate. In accordance with the invention, the sub-plates may have different dimensions that have the effect of adjusting the capacitance and hence the frequency of the attached microwave device as the sub-plates are combined together. In some embodiments due to the physical layout of the moving plate relative to the sub-plates, such as the one shown in FIG. 8 in which the moving plate and sub-plates are parallel to each other, the areas of the sub-plates are related to each other in some manner which corresponds to the desired tuning such as the resulting frequency of the device connected to the direct digitally tunable element. The overall varactor capacitance or the cantilever beam deflection. In other embodiments, the relative capacitance generated by the sub-plates have a predetermined relationship to each other which causes the desired tuning effect. In either case, it is the relative effect that each sub-plate has on the capacitance of the direct digitally tunable element that causes the desired tuning effect.

In this embodiment, a largest sub-plate 804 has dimensions and an area such that the sub-plate covers about ½ of the first plate 801 area (i.e., the largest sub-plate is ½ the width of the first plate is this embodiment). The sub-plate may be positioned parallel to the cantilever beam direction. In addition, each other sub-plate may be positioned parallel to the moving plate so that the relative effect of each sub-plate on the capacitance of the direct digitally tunable element is related to the area of the sub-plate relative to the other sub-plates. A next largest sub-plate 805 may be ½ the area of the first sub-plate 804 and may be located parallel to the sub-plate 804. In addition, there may be other sub-plates are mounted in parallel, each ½ the width of the previous sub-plate. Thus, each of the sub-plates of the array of these parallel sub-plates has an overlapping area with the main plate that diminishes by a power of 2 from the largest plate to the next plate and so on so that the overlapping areas represent binary weights. The smallest sub-plates may require a width below the minimum design rule of the particular manufacturing process so that the smallest sub-plate cannot be produced. However, this limitation is overcome by reducing the length of a smaller sub-plates 807 as shown in the figure to produce the desired area without violating the minimum design rules.

The term "weight" as used herein refers to the magnitude of an effect. For example, a weight may describe a plate deflection in microns when a particular sub-plate is charged, or a weight may represent the resulting capacitance or other desired measurable effect, such as tuning frequency, of the varactor that is applied to a tuning circuit. As long as the overall weights cause small deflections of the first plate 801, the deflection is approximately linear and the superposition of weights is a good approximation of the combined effect. The term "binary weight" as used herein refers to the magnitude of an effect where the difference between the effect of different sub-plates, for example, is related by a power of 2.

Each sub-plate 804. 805, 807 may be DC-isolated from the other sub-plates and also from the substrate 803. Each sub-plate may also be charged by a binary-level (digital) voltage via one or more conductors 806 connected to each sub-plate. When a selected subgroup of the sub-plates are electrically charged by the digital voltages so that a predetermined area of the sub-plates are charged, the first plate 801 bends towards the sub-plates by the electrostatic attraction between the first plate and the sub-plates. The amount of deflection of the first plate 801 depends how many of the sub-plates are charged (or how much total area of the sub-plates is charged) so that the digital signals controlling the sub-plates affect the deflection of the first plate which in turn affects the capacitance of the varactor and may be used to tune a microwave device. In other words, the deflection of the first plate changes the capacitance to ground of the variator at microwave frequencies so that the entire collection of sub-plates 804, 805, 807 acts like a ground plane at microwave frequencies providing the varactor tuning capability.

While the charging of a group of the parallel sub-plate arrangement shown causes a deflection of the first plate 801 that is proportional to the sub-plate area, this is only an approximation. Several effects may cause the proportion between the charged area of the sub-plates and the relative deflection of the first plate to be inaccurate. These effects include electric field distribution and the fringe effects of capacitor plates. By proper design, the sub-plates may be adjusted in size or position to compensate for these effects. In addition, the sub-plates may have weights whose relative proportions are not a power of 2 and a digital circuit may compensate for the unevenness by translating the desired total weight to the nearest combination of actual weights. For example, if the actual weight of sub-plates 1 to N is $W_1$, $W_2 \ldots W_N$, then it is possible to calculate the binary word $B_1, B_2 \ldots B_N$, where the total weight W is equal to $B_1W_1+B_2W_2\ldots+B_NW_N$ such that this weight is the nearest to the desired weight. Each bit $B_i$ where i ranges from 1 to N has binary values of 0 and VCC where VCC is a desired controlled voltage. This concept can be directly extended to multi-level discrete values so that $B_i$ may be a multi-level valued word assuming the voltages VCC, VCC/2, VCC/4 and so on including 0, or any other set of discrete voltages. For weight summing of W, $B_i$ is assumed to have a set of discrete values 1, ½, ¼ and so on including 0. The binary control word calculation may be carried out in the digital Processor 301 (shown in FIG. 3), based on experimental or simulated estimates of the weights $W_1, W_2 \ldots W_N$.

As the differential deflection caused by a group of selectively charged subset of the sub-plates causes the first cantilevered plate 801 to flex longitudinally, the plate 801 may be stiffened in the longitudinal direction by placing one or more thickening bars 809 in one or more selected places along the length of the plate 801. These bars can be made of either insulating material or may be thick pieces of the same metal as the plate 801. For illustration, only a single bar 809 is shown, although multiple parallel bars spaced roughly evenly along the length of the plate 801 are preferred. Now, another embodiment of a direct digitally controlled element will be described.

Figure 9:
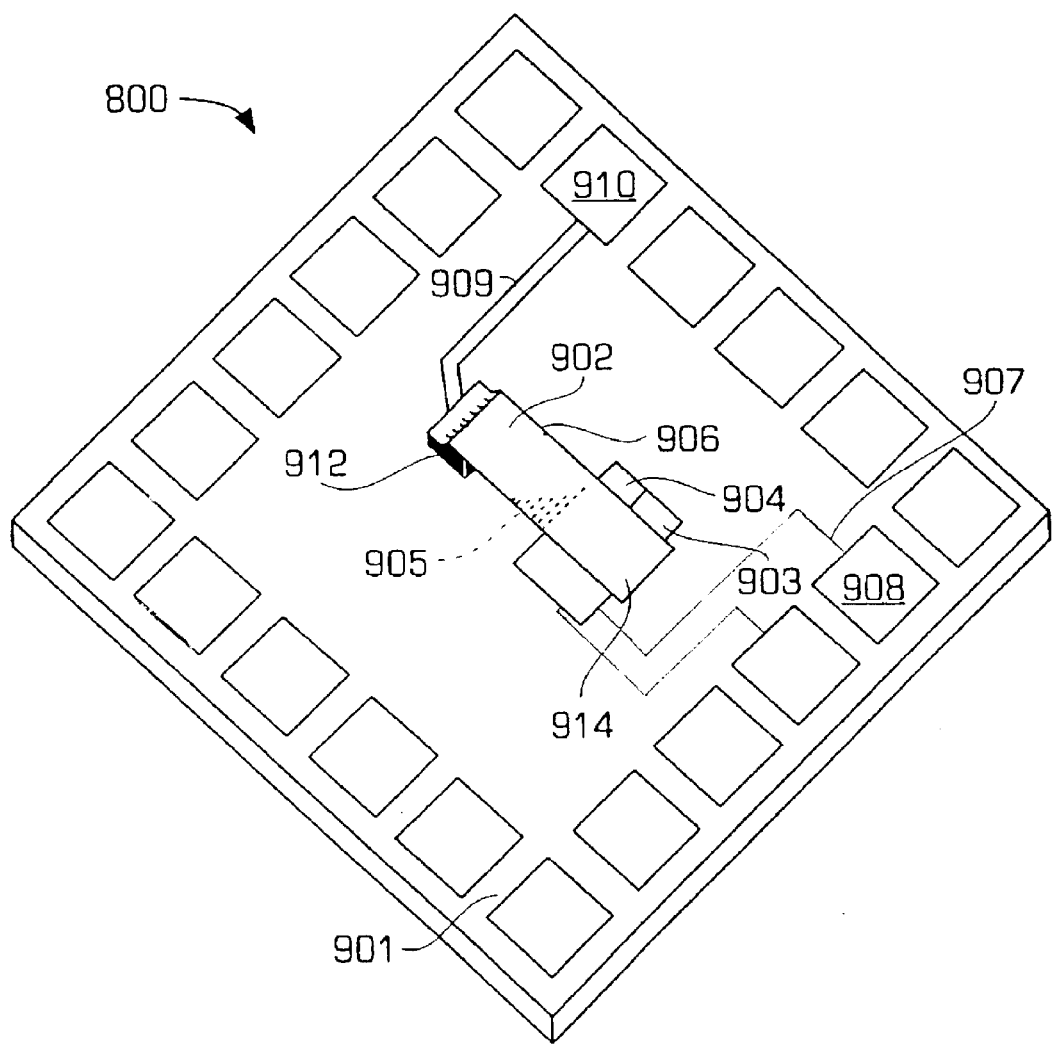
FIG. 9 illustrates a digitally controlled capacitor in accordance with the invention with a moving cantilever beam and sub-plates arranged perpendicularly to the beam.

FIG. 9 illustrates another embodiment of a cantilever digital varactor 800. In this embodiment, the one or more sub-plates 903, 904 may be formed on or mounted on a substrate 901 perpendicular to a suspended, cantilevered plate 902 and the cantilevered plate is supported by an insulating foundation 912. As described above, in this embodiment, the relative effect of each sub-plate on the capacitance of the capacitor and the tuning effect of the capacitor is not directly related to the area of each sub-plate since the sub-plates closer to the end of the moving plate have a greater bending effect on the moving plate. A largest-weight sub-plate 903 may be mounted near a free end 914 of the suspended plate 902 and other sub-plates 904 of smaller widths may be mounted parallel to the larger sub-plate 903 and perpendicular to the cantilevered plate 902. One or more still smaller sub-plates 905 may have smaller overlaps with the suspended plate 902 since they are shorter to avoid violating the design rules as described above. Since the distance of each sub-plate 903–905 from the free end 914 of the suspended plate 902 is not the same, the bending moments caused by the charging of each sub-plate is different even if two sub-plates have equal area. Therefore, for this embodiment, if binary weights are desired, the areas or positions of the sub-plates can be adjusted by simulation or experimentation as will now be described.

In accordance with the invention, a method for adjusting the area or position of each sub-plate may include positioning a first sub-plate of a desired weight-effect relative to the cantilevered plate where desired and adjusting the width of said plate until the desired weight-effect associated with said sub-plate is achieved and confirmed by measurement or simulation. Next, a second sub-plate may be positioned relative to the first sub-plate and the dimensions of the second sub-plate (i.e., length, width and/or thickness) may be adjusted until the desired weight-effect associated with said second sub-plate is achieved and confirmed by measurement or simulation. Returning to the varactor shown in FIG. 9 as an example, the first sub-plate 903 may be positioned where desired relative to the cantilever plate 902 and may be widened until ½ of the total weight (i.e., ½ the total deflection of the cantilever plate is caused by the first sub-plate) is achieved. Then the second plate 904 is positioned and width-adjusted until an extra ¼ of weight is added. The process continues with a third sub-plate at ⅛$^{th}$ of the weight and so on until reaching a plate too narrow to manufacture. To make the sub-plates that are too narrow, these sub-plates are made shorter rather than narrower as described above. The operation of this embodiment is the same as above and will therefore not be described here.

Although an array of sub-plates parallel to the cantilever plate charged with digital voltages (FIG. 8) and an array of sub-plates perpendicular to the cantilever plate charged with digital voltages (FIG. 9) are shown and described, other combinations of sub-plates are also possible in accordance with the invention. For example, one of the sub-plates may be charged with an analog voltage, such as small sub-plate 906 in FIG. 9.

Returning to FIG. 9, each sub-plate can be connected by a conductor 907 to a bonding pad 908 if so desired. The suspended plate 902 may be also connected to a bonding pad 910 via a printed transmission line 909 to be able to apply a voltage to the plate or measure the deflection or capacitance of the first plate. In many applications, the cantilever plate may be electrically connected directly or via bond wire to a resonating element that it is supposed to tune, such as in FIG. 13 as described below.

The digitization of micro-machined capacitors by use of multiple control electrodes (sub-plates) in accordance with the invention is applicable to other forms of capacitors, including interdigital capacitors. Thus, similar to the parallel and perpendicular sub-plate arrangements shown in FIGS. 8 and 9, respectively, similarly divided sub-plates may be used for an interdigital capacitor as shown in FIGS. 10 and 11 and as will now be described.

Figure 10:
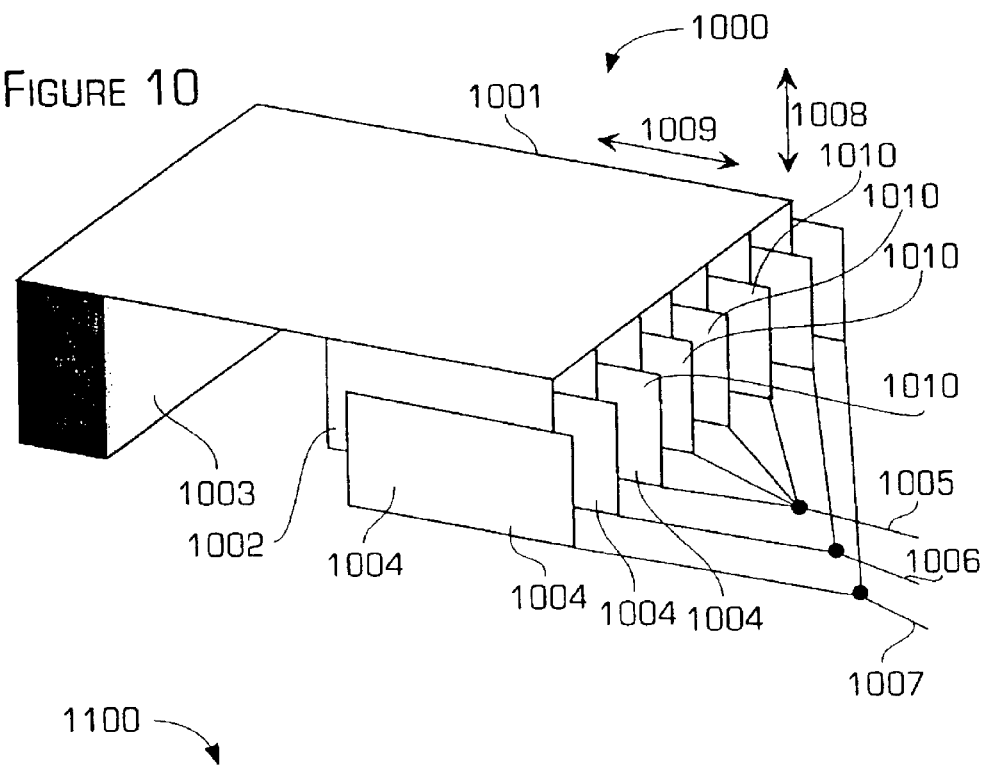
FIG. 10 illustrates a plate arrangement of a digitally controlled capacitor in accordance with the invention with a moving plate based on an interdigital cantilever beam.

FIG. 10 illustrates a plate arrangement in accordance with the invention for an interdigital capacitor 1000. An electrically conductive cantilever beam 1001 may be integrally connected to a set of conductive parallel plates 1002 that move as the cantilever plate deflects and the cantilevered plate is mounted on and cantilevered from an insulative support base 1003. One or more static plates 1004 are attached to the substrate and each static plate is positioned between two conductive parallel plates 1002. These static plates are conductive, but are electrically isolated from each other at DC and low frequency. However, at microwave frequencies, they are at ground potential. The movement of the cantilevered plate 1001 is caused by electrostatic attraction, like the cantilever example of FIG. 8. The binary weights for tuning are created by grouping one or more static plates to represent a desired weight. In the example shown, four central static plates 1010 are electrically connected by a conductor 1005 together, forming the most significant bit (MSB), while another pair is connected by a conductor 1006 to form the next bit. In this embodiment, the minimum number of plates per bit is two, to allow symmetry of the attraction forces. To add more bits, other pairs of plates are made shorter in the horizontal dimensions, i.e. the plates connected to a wire 1007 may be shorter than the plates connected to the wire 1006.

Figure 11:
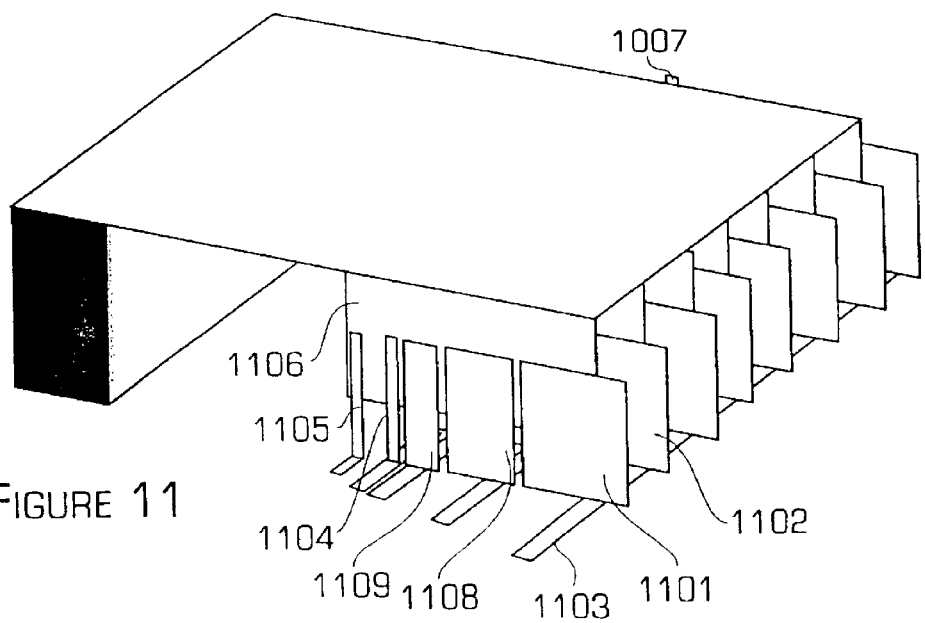
FIG. 11 illustrates an example of a plate arrangement of a digitally controlled capacitor in accordance with the invention with a moving plate based on an interdigital cantilever beam and sub-plates arranged perpendicularly to the moving interdigital beam.

If the moving plates 1002 are not rigid enough to avoid sticking to a static plate 1004 in the boundary between two static plates of different bits, another plate arrangement can be used, as shown in FIG. 11 and as described below. While the drawing in FIG. 10 shows a cantilever structure 1001 that deflects vertically due to electrostatic attraction, as indicated by an arrow 1008, other well known interdigital capacitors exist in which the deflection movement is horizontal, as indicated by another arrow 1009. Since the capacitance (and hence the tuning) is substantially proportional to the overlapping areas of the static plates and moving plates, either a horizontal or vertical deflection interdigital capacitor may be used in accordance with the invention to provide microwave tuning.

FIG. 11 shows another embodiment of a direct digitally tuned interdigital capacitor 1100 in accordance with the invention. In this embodiment, a set of static plates 1101, 1102 may be divided over their lengths into one or more sub-plates. For example, a MSB sub-plate 1101 may be sub-divided into on or more sub-plates such as sub-plates 1108, 1109. The MSB plate 1101 may also be electrically connected to other similar sub-plates, such as the sub-plate 1102. All of these sub-plates may then be electrically connected to a conductor 1103. After the minimum attainable plate width has been reached, other sub-plates 1104 may be mounted on the external side only and at a varying distance from a static plate 1106, as shown with the sub-plate 1105. These sub-plates are mounted symmetrically on both sides of the moving structure, so that sub-plate 1104 has a peer 1107.

Figure 12:
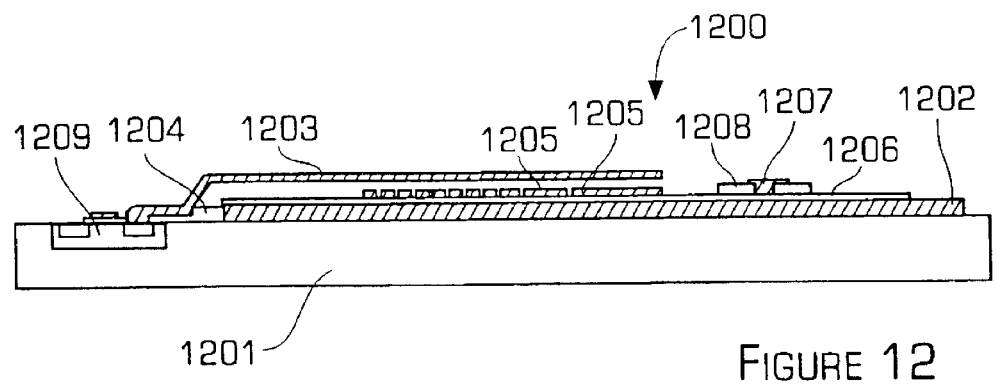
FIG. 12 illustrates a cross section of a cantilever beam with digital control sub-plates mounted on a substrate with other components in accordance with the invention.

FIG. 12 illustrates a cross-sectional view of a digitally controlled capacitor 1200 in accordance with a preferred embodiment of the invention. In a preferred embodiment, the digitally controlled capacitor is manufactured on a semiconductor substrate taking advantage of existing semiconductor manufacturing processes available in the microelectronic industry. This capacitor 1200 uses a set of sub-plates perpendicular to the cantilever plate discussed above in conjunction with FIG. 9. The capacitor 1200 may include a semiconductor substrate 1201, such as silicon or gallium arsenide, that supports the capacitor structure. A metalization layer 1202 creates a shield between the capacitor and any noise present in the substrate. A set of sub-plates 1205 may be etched from a metalization layer resting on top of an insulating layer 1206. Next, a capacitor cantilever plate 1203 may be deposited on an insulation layer 1204. The suspension is manufactured by a well known air-bridge technique in which the air gap was initially a sacrificial layer on which the cantilever plate 1203 was deposited and etched, and finally the sacrificial layer was removed. Various well known wafer processing techniques may allow the deposition of other components found in integrated circuits, including resistors 1207 and their interconnection leads 1208. Various active semiconductor devices, such as a MOS transistor 1209, may also be fabricated. The choice of the types of active devices is based on the technology available for a particular substrate material. The cantilever plate 1203 is not necessarily connected to the active device 1209 as illustrated in FIG. 12.

While the substrate 1201 is made of a semiconductor material in the preferred embodiment, other substrate materials are possible, such as a ceramic or a metal. If the substrate is made of metal, the shield layer 1202 may consist of another type of metal to reduce noise. Another alternative is to have the substrate and shield made of the same metal, essentially obviating the need for the separate layer 1202.

Figure 13:
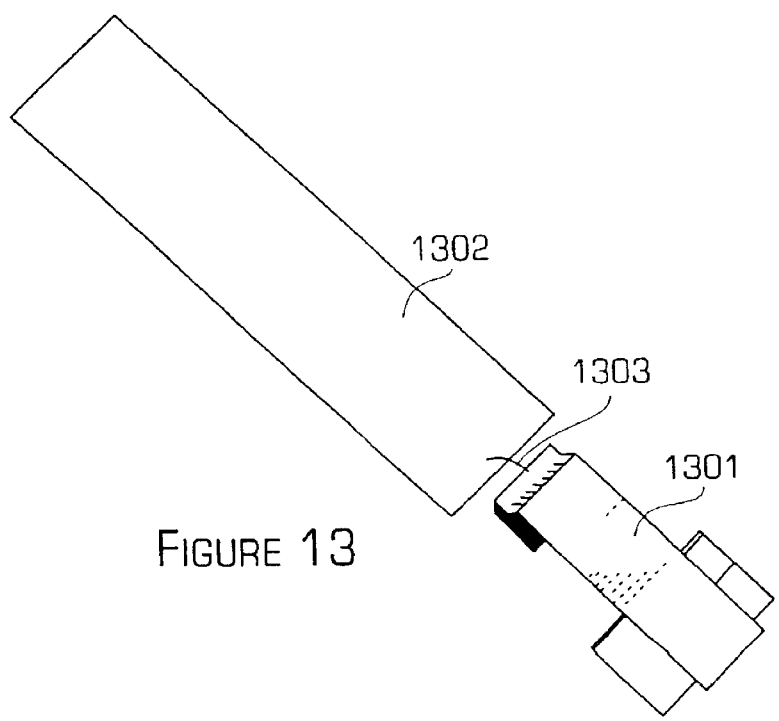
FIG. 13 illustrates a digitally tuned capacitor in accordance with the invention electrically connected to a microwave resonator.

FIG. 13 illustrates a digitally controlled cantilever plate capacitor 1301 in accordance with the invention that may be electrically connected to a passive resonator element 1302. The resonator element 1302 may be made of a conducting surface that may be a microstrip trace on a substrate or a metal structure suspended in air and bonded to the substrate by hybrid technologies. The capacitor 1301 may be connected to resonator 1302 by a bond wire 1303 or regular printed conductor thin film techniques. Now, another embodiment of a direct digitally controlled microwave element will be described.

Figure 14:
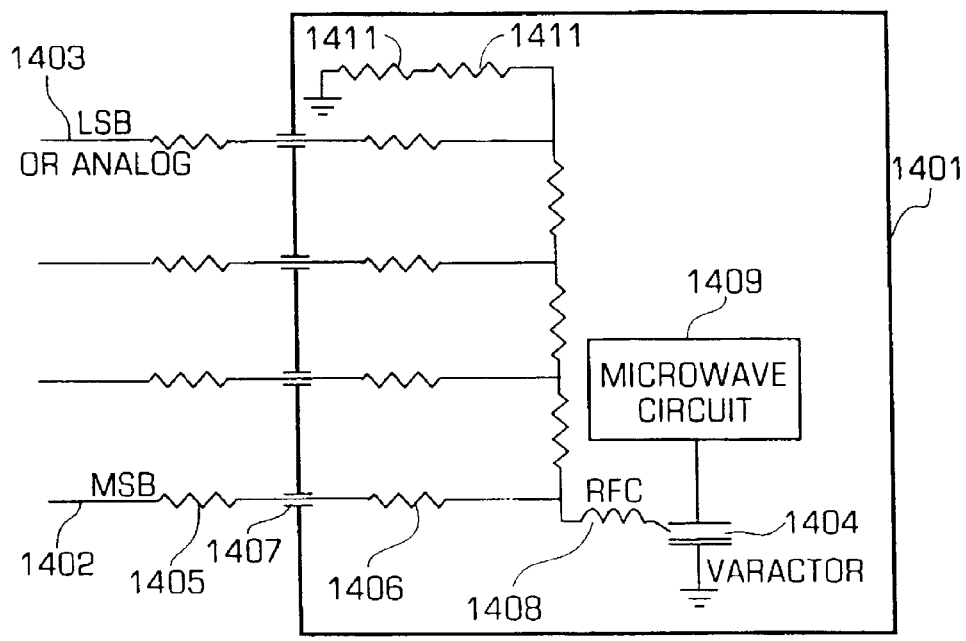
FIG. 14 illustrates a noise-isolated direct digitally controlled microwave circuit in accordance with the invention with a resistor-ladder D/A converter.

FIG. 14 illustrates another embodiment for directly digitally controlling a microwave tuning element that may be part of a microwave circuit 1409, such as oscillator and filter. The digitally controlled microwave circuit may be enclosed in a shielded structure 1401. The shield 1401 may contain, for example, the DCO 603 shown in FIG. 6 or the DCO 704 shown in FIG. 7. This shield 1401 should not be confused with the shield 604 of the outer control structure. The clean logic signals, such as the MSB 1402 and analog voltage or LSB 1403, are fed to a controlled device 1404, such as a variable capacitor, via an R–2R D/A resistor ladder converter.

The resistors shown in FIG. 14 may all be of the same value. The 2R branch for each bit, such as MSB 1402, may split equally between a resistor 1405 outside the shield and a resistor 1406 inside the shield, and between them a noise rejection bypass capacitor 1407, implemented partially or entirely as a feed-through capacitor. Each resistor pair 1405, 1406 may consist of unequal resistors as long as their sum equals the 2R value of the DC-equivalent resistor ladder structure. It is possible even to have the entire branch resistance 2R kept outside of the shield for maximum RC time constant formed by the resistor 1405 and capacitor 1407. In that case, the resistor 1406 can be replaced by a conductor. The DC control voltage is isolated at the microwave frequency by an RFC 1408, and the control voltage drives the voltage tuned device, such as a varactor 1404. This varactor may consist of a conventional semiconductor tuning diode or a micro-machined varactor. The tuning device 1404 tunes the microwave circuit 1409, such as an oscillator or a filter structure.

Figure 15:
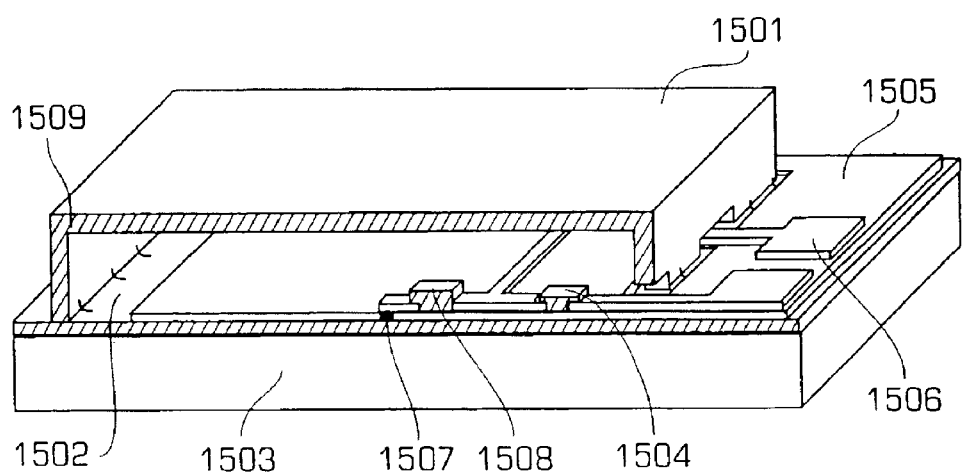
FIG. 15 illustrates a cross section through a shielding structure of the noise-isolated direct digitally controlled microwave circuit of FIG. 14.

FIG. 15 illustrates a three dimensional cut-away view of a shield 1501. In particular, the shield 1501 may consist of a metal cap 1509 bonded to a metal layer 1502 on top of a substrate 1503. One or more resistors 1504 may be formed on an insulation layer 1505 above the metal layer 1502. One or more bonding pads 1506 may provide connection to the outside components. Thus, in this embodiment the shield 1401 of FIG. 14 is implemented as a combination of the cap 1509 and the metal layer 1502. The insulation layer 1505 may include conductive via holes 1507. The components shown in FIG. 15 may correspond to various components in FIG. 14. For example, the resistor 1504 may correspond to the resistor 1406, while the resistor 1508 may represent the combined resistance of the two resistors 1411. The feed-through capacitor 1407 may be the capacitance between the input conductor 1509 and the ground structures surrounding it, consisting of the shield 1501 and the conductive layer 1502 underneath.

The manufacturing of the various structures disclosed above is possible by several existing techniques related to thin film technology and micromachining. Some references to literature on microwave tunable capacitors can be found in the book "Introduction to Microelectromechanical (MEM) Microwave Systems" by Hector De Los Santos, Artech House, 1999, and "Fundamentals of Microfabrication" by Marc Madou, CRC Press, 1997.

Figure 16:
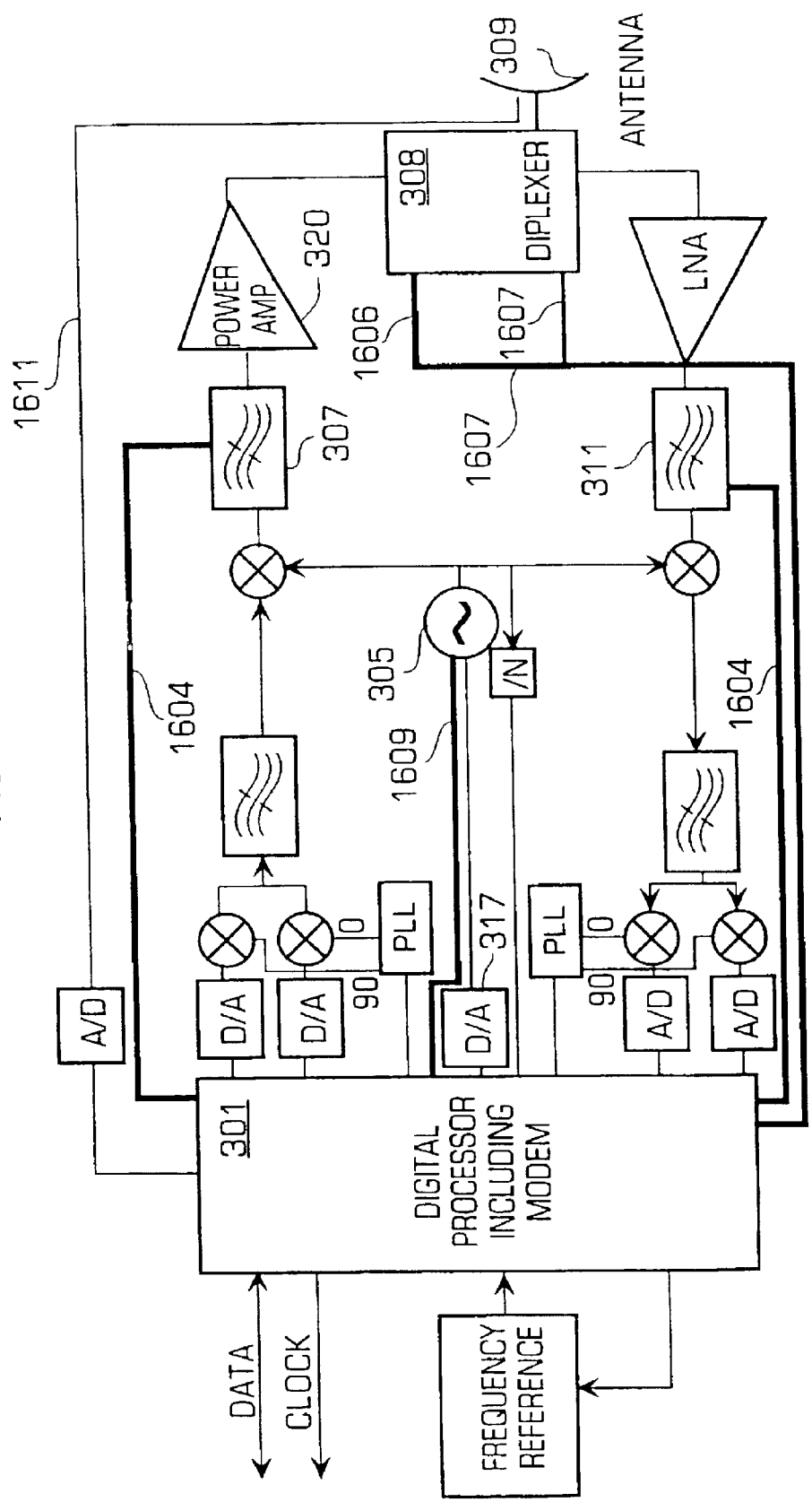
FIG. 16 illustrates a block diagram of a digital microwave transceiver including direct digitally tuned circuits in accordance with the invention.

FIG. 16 illustrates a typical radio transceiver incorporating a direct digitally controlled devices techniques in accordance with the invention disclosed above that improve a radio transceiver front end. This figure shows various elements the correspond to elements in FIG. 3 and these elements will not be described here, but the digitally controlled elements will be pointed out. A digital processor 301 may tune the filters 307, 311 digitally via control buses 1604. Each bus, drawn as a thick line, may also contain an analog line, in which case, the digital processor includes a D/A converter 317 either built in or mounted externally. The diplexer 308 may be controlled by a transmit bus 1606 and a receive bus 1607. The DCO 305 refers to the "outer structure", such as the entire circuitry shown in FIG. 7, in which the control bit 705 corresponds to a wire in a VCO control bus 1609. The coarse tuning of any of these filers and oscillators may be done by a known mapping between the frequency and the tuning control word. Such a mapping can be found by design or product calibration and later fine tuning can be done by feedback techniques, such as the phase locked loop for the DCO 305 and receiver signal level optimization for the diplexer 308 and receive filter 311. To provide feedback control of the transmit filter 307 and diplexer 308, an amplitude measurement feedback line 1611 may be included. Feedback control is accomplished by searching for the optimum desired level. If desired, dither techniques of turning on and off one of the lowest significance control bits can be used to search for the control loop direction to the maximum value.

While the foregoing has been with reference to a particular embodiment of the invention, it will be appreciated by those skilled in the art that changes in this embodiment may be made without departing from the principles and spirit of the invention, the scope of which is defined by the appended claims.

What is claimed is:

1. A direct digitally controlled capacitor for tuning a circuit to a microwave frequency, the capacitor comprising:
   a moving plate that deflects in response to a second plate being charged;
   the second plate comprising two or more sub-plates electrically isolated at DC or low frequencies from each other and from said moving plate, the sub-plates controlling the deflection of the moving plate in order to change the capacitance of the capacitor to tune a microwave device coupled to the capacitor; and
   a plurality of tuning signals attached to the sub-plates of the capacitor for controlling the capacitor.

2. The capacitor of claim 1, wherein the sub-plates of the capacitor further comprises two or more sub-plates, a first sub-plate having predetermined area such that the capacitance change of the capacitor based on the first sub-plate is approximately ½ of the total capacitance of the capacitor and a second sub-plate having a second predetermined area so that the change in the capacitance of the capacitor based on the second sub-plate is approximately ½ the change caused by the first sub-plate to create a binary weighting of the sub-plates so that when one or more of the sub-plates are charged, the control plate deflects a predetermined amount to change the capacitance of the capacitor and tune the microwave device attached to the capacitor.

3. The capacitor of claim 1, wherein the sub-plates of the capacitor further comprises two or more sub-plates, a first sub-plate having an area such that the capacitance chance of the capacitor is approximately ½ of the total capacitance of the capacitor and a second sub-plate having an area equal to approximately ½ of the area of first sub-plate so that when one or more of the sub-plates are charged, the control plate deflects a predetermined amount to change the capacitance of the capacitor and tune the microwave device attached to the capacitor.

4. The capacitor of claim 1, wherein the dimensions of each of said sub-plates that is driven by each of said tuning signals are set to represent a predetermined, substantially additive, binary weight of a desired tuning effect caused by the moving plate.

5. The capacitor of claim 4, wherein the area of each sub-plate is decreased by decreasing the width of the each sub-plate.

6. The capacitor of claim 5, wherein the area of a sub-plate having a width too small to manufacture is decreased by changing the length of the sub-plate.

7. The capacitor of claim 1, wherein the moving plate of the capacitor comprises a cantilevered beam and wherein said sub-plates are arranged in parallel to said cantilevered beam attached to the substrate.

8. The capacitor of claim 1, wherein the moving plate of the capacitor further comprises a cantilevered beam and wherein said sub-plates are arranged perpendicular to said cantilevered beam on the substrate.

9. The capacitor of claim 1, wherein the moving plate of the capacitor further comprises an interdigital cantilevered beam and wherein said sub-plates are static interdigital beams divided in parallel to said moving cantilevered beam.

10. The capacitor of claim 1, wherein the moving plate of the capacitor further comprises an interdigital cantilevered beam and wherein said sub-plates are static interdigital beams divided perpendicularly to said moving digital beam.

11. The capacitor of claim 1, wherein a largest plane of at least one of the sub-plates is positioned substantially parallel to a largest plane of the moving plate.

* * * * *